(12) United States Patent
Sundararajan et al.

(10) Patent No.: US 9,916,988 B2
(45) Date of Patent: Mar. 13, 2018

(54) SACRIFICIAL MATERIAL FOR STRIPPING MASKING LAYERS

(71) Applicant: INTEL CORPORATION, Santa Clara, CA (US)

(72) Inventors: Shakuntala Sundararajan, Hillsboro, OR (US); Nadia Rahhal-Orabi, Lake Oswego, OR (US); Leonard P Guler, Hillsboro, OR (US); Michael Harper, Hillsboro, OR (US); Ralph Thomas Troeger, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/914,627

(22) PCT Filed: Sep. 25, 2013

(86) PCT No.: PCT/US2013/061735
§ 371 (c)(1),
(2) Date: Feb. 25, 2016

(87) PCT Pub. No.: WO2015/047255
PCT Pub. Date: Apr. 2, 2015

(65) Prior Publication Data
US 2016/0203999 A1 Jul. 14, 2016

(51) Int. Cl.
*H01L 21/311* (2006.01)
*H01L 21/02* (2006.01)
(Continued)

(52) U.S. Cl.
CPC .. *H01L 21/31144* (2013.01); *H01L 21/02282* (2013.01); *H01L 21/0332* (2013.01);
(Continued)

(58) Field of Classification Search
CPC ........... H01L 21/02282; H01L 21/0332; H01L 21/31051; H01L 21/76814;
(Continued)

(56) References Cited

U.S. PATENT DOCUMENTS

2003/0170993 A1* 9/2003 Nagahara .......... H01L 21/02063
438/694
2004/0121506 A1 6/2004 Gogoi
(Continued)

FOREIGN PATENT DOCUMENTS

KR 1020120055153 A 5/2012
TW 201234671 8/2012

OTHER PUBLICATIONS

International Preliminary Report on Patentability for PCT/US2013/061735, dated Apr. 7, 2016, 6 pages.
(Continued)

*Primary Examiner* — Marcos D Pizarro
*Assistant Examiner* — Long H Le
(74) *Attorney, Agent, or Firm* — Jordan IP Law, LLC

(57) ABSTRACT

Techniques and structures for protecting etched features during etch mask removal. In embodiments, a mask is patterned and a substrate layer etched to transfer the pattern. Subsequent to etching the substrate layer, features patterned into the substrate are covered with a sacrificial material backfilling the etch mask. At least a top portion of the mask is removed with the substrate features protected by the sacrificial material. The sacrificial material and any remaining portion of the mask are then removed. In further embodiments, a gate contact opening etched into a substrate layer is protected with a sacrificial material having the same composition as a first material layer of a multi-layered etch mask. A second material layer of the etch mask having a similar composition as the substrate layer is removed before
(Continued)

subsequently removing the sacrificial material concurrently with the first mask material layer.

20 Claims, 13 Drawing Sheets

(51) Int. Cl.
*H01L 21/8234* (2006.01)
*H01L 21/033* (2006.01)
*H01L 21/3105* (2006.01)
*H01L 27/088* (2006.01)
*H01L 29/06* (2006.01)
*H01L 29/40* (2006.01)
*H01L 21/768* (2006.01)

(52) U.S. Cl.
CPC .. *H01L 21/31051* (2013.01); *H01L 21/76814* (2013.01); *H01L 21/823437* (2013.01); *H01L 27/088* (2013.01); *H01L 29/0657* (2013.01); *H01L 29/401* (2013.01)

(58) Field of Classification Search
CPC ........... H01L 21/823437; H01L 27/088; H01L 29/0657; H01L 29/401
See application file for complete search history.

(56) References Cited

U.S. PATENT DOCUMENTS

| | | | |
|---|---|---|---|
| 2008/0008969 A1* | 1/2008 | Zhou | H01L 21/0337 430/313 |
| 2010/0120253 A1 | 5/2010 | Jeng et al. | |
| 2011/0070733 A1 | 3/2011 | Kikuchi et al. | |
| 2011/0207285 A1* | 8/2011 | Kim | H01L 21/31144 438/382 |
| 2011/0300685 A1* | 12/2011 | Horii | H01L 27/2409 438/382 |
| 2012/0021607 A1* | 1/2012 | Huang | H01L 21/0338 438/703 |
| 2012/0244694 A1* | 9/2012 | Shinohara | H01L 27/105 438/591 |
| 2015/0031210 A1* | 1/2015 | Ban | H01L 21/0337 438/703 |
| 2015/0064914 A1* | 3/2015 | Kong | H01J 37/32082 438/696 |

OTHER PUBLICATIONS

Official Letter and IPO Search Report for Taiwan Patent Application No. 103132798, dated Feb. 26, 2016, 4 pages.

* cited by examiner

SACRIFICIAL MATERIAL FOR STRIPPING MASKING LAYERS

TECHNICAL FIELD

Embodiments of the invention generally relate to nanofabrication of integrated devices, and more particularly pertain to removal of etch mask material layers from an etched substrate layer.

BACKGROUND

Monolithic ICs generally comprise a number of transistors, such as metal-oxide-semiconductor field-effect transistors (MOSFETs) fabricated over a planar substrate, such as a silicon wafer. While Moore's Law has held true for decades within the IC industry, scaling of IC dimensions is becoming more difficult with the most advanced MOSFET gate dimensions now below 20 nm. As device sizes continue to decrease, substrate films that are patterned during an etching process have reduced thicknesses and feature sizes, which are increasingly intolerant to the stripping processes employed to remove sacrificial etch mask materials. This is particularly true for the most critical patterning layers, such as gate electrode patterning and gate contact patterning because the fine geometries at these operations place the most extreme constraints on the masking material performance and etch processes. As a result, an etch mask may have a material composition (either as deposited, or as modified by an etch process employed to pattern the substrate layer) that is difficult to remove with sufficient selectivity relative to the substrate layer to avoid collateral damage to non-sacrificial etched features.

Techniques and structures for removing sacrificial etch masks without damaging the sensitive etched substrate layers would therefore be advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
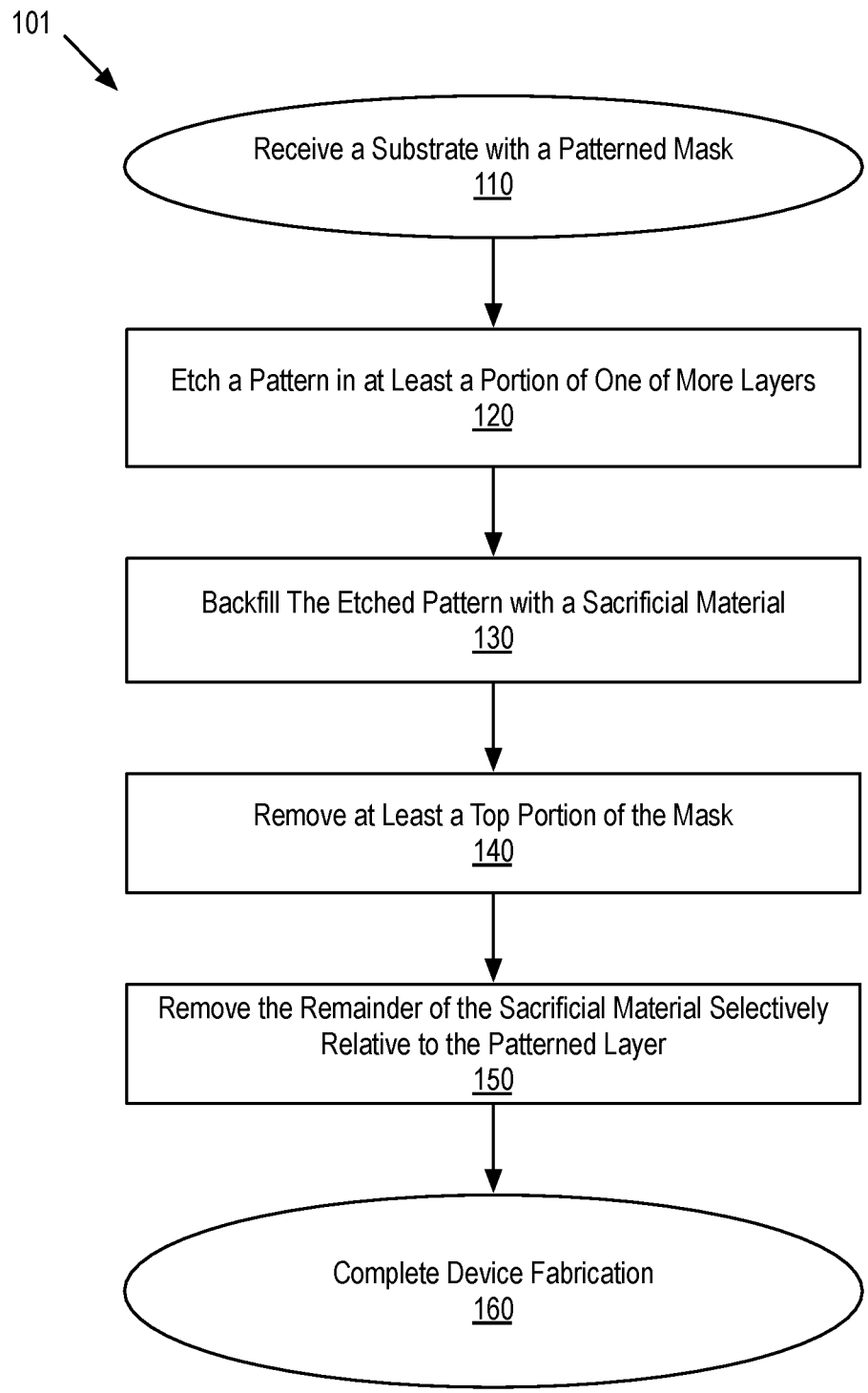
FIG. 1 is a flow diagram illustrating a method of stripping an etch mask from a substrate with a sacrificial material, in accordance with and embodiment.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Terms such as "upper" and "lower" "above" and "below" may be understood by reference to illustrated X-Z coordinates, and terms such as "adjacent" may be understood by reference to X,Y coordinates or to non-Z coordinates. Therefore, the following detailed description is not to be taken in a limiting sense and the scope of claimed subject matter is defined solely by the appended claims and their equivalents.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Techniques and structures for protecting etched features during etch mask removal are described herein. Unlike existing methodologies which target an etch critical dimension (CD) and removal of a sacrificial pattern defining mask in a single etch step, embodiments described herein decouple CD control and etch mask removal into independent etch steps, thereby allowing for greater margin in the patterning etch process. In embodiments, a mask is patterned and a substrate layer etched to transfer the pattern with the desired CD. Subsequent to etching the substrate layer, features patterned into the substrate are covered with a sacrificial material backfilling the etch mask. At least a top portion of the mask is removed while the sacrificial material protects the substrate features. The sacrificial material and any remaining portion of the mask are then removed. In further embodiments, a gate contact opening etched into a substrate layer is subsequently protected with a sacrificial material having the same composition as a first material layer of a multi-layered etch mask. A second material layer of the etch mask having a similar composition as the substrate layer is removed before subsequently removing the sacrificial material concurrently with the first mask material layer.

FIG. 1 is a flow diagram illustrating a method 101 of stripping an etch mask from a substrate with a sacrificial material, in accordance with and embodiment. FIGS. 2A, 2B, 2C, 2D, and 2E are cross-sectional views of an integrated device structure evolving as selected operations in the method 100 are performed, in accordance with one exemplary embodiment.

Figure 2A:
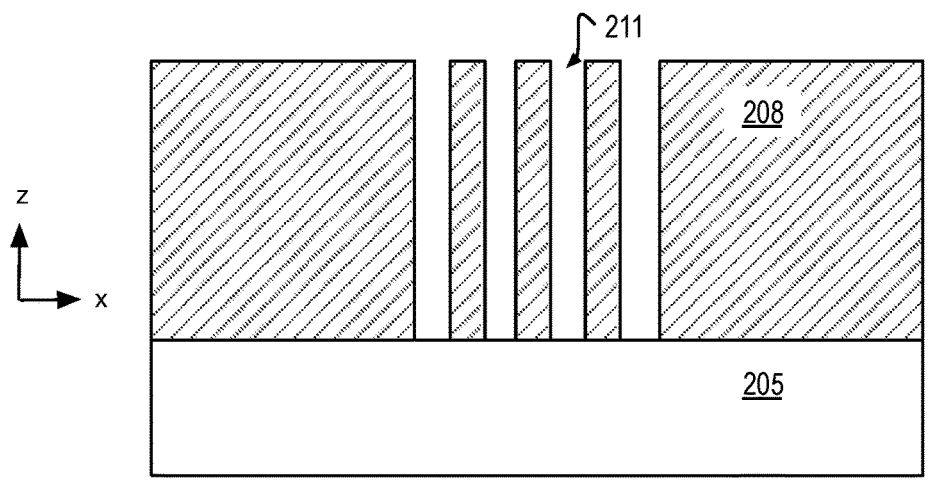
FIGS. 2A, 2B, 2C, 2D, and 2E are a cross-sectional views of an integrated device structure evolving as selected operations in the method depicted in FIG. 1 are performed, in accordance with an embodiment.

Method 101 begins with receiving a substrate layer disposed below a patterned mask at operation 110. The substrate layer may be any material suitable for forming an integrated device. The substrate material layer(s) may be non-sacrificial in that at least a portion of the material layer is ultimately present in a final device structure, or the substrate layer may also be sacrificial and absent from a final device structure. As certain embodiments are not limited with respect to the particular material composition of the substrate layer, the term "substrate layer" may include any and all films present in the starting material input into method 101. Exemplary embodiments include, but are not limited to: bulk semiconductor materials (e.g., a substantially monocrystalline semiconductor, such as, but not limited to, silicon), bulk semiconductor-on-insulators (SOI) material, bulk insulators (e.g., sapphire); thin film material layer(s), such as, but not limited to, dielectrics (e.g., silicon dioxide, silicon nitrides, metal oxides), metals, organics; and/or any combinations of thin film layers and bulk materials. FIG. 2A illustrates one exemplary embodiment where substrate layer 205 represents one or more thin film substrate layers and/or bulk substrate layers, at least one of which is to be patterned through performance of method 101.

In embodiments, a patterned mask includes one or more material layers suitable for masking a subsequently performed etching of one or more substrate layer. As certain embodiments are not limited with respect to the particular material composition of the mask, the term "mask" includes any and all sacrificial masking films present on the starting material input into method 101. Hence, in FIG. 2A patterned mask 208 represents any number of compositionally distinct non-photo-definable "hard" mask material layers and/or photo-definable masking material layers. As used herein, photo-definable materials are sensitive to, and modifiable by, radiation employed in a lithographic patterning process (e.g., positive and negative photoresists). Non-photo-definable materials are insensitive to lithographic processing. Mask 208 may also be a multi-layered masking stack, which may have one or more photo-definable material layers and/or one or more non-photo-definable material layers). Exemplary hard mask materials include, but are not limited to: inorganic dielectrics (e.g., silicon dioxide, silicon oxynitride, silicon nitride, silicon carbide); organic dielectrics, such as bottom anti-reflective coatings (BARCs); and carbon-based films having significantly higher carbon content that of a BARC, (e.g., CVD carbon, and spin-on carbon).

Regardless of composition, a mask received at operation 110 is patterned and may have been patterned with any process suitable for the particular mask composition. For example, in FIG. 2A, mask features 211 are patterned into mask 208. In a photoresist mask embodiment, a lithographic exposure and develop process may have been utilized to form such mask features. In a hard mask embodiment, a dry etch process may have been utilized to transfer such mask features from a pattern previously printed with lithography or other non-lithographic technique. In a multi-layered mask embodiment, such mask features may be the result of both lithographic printing and dry etch processes.

Figure 2B:
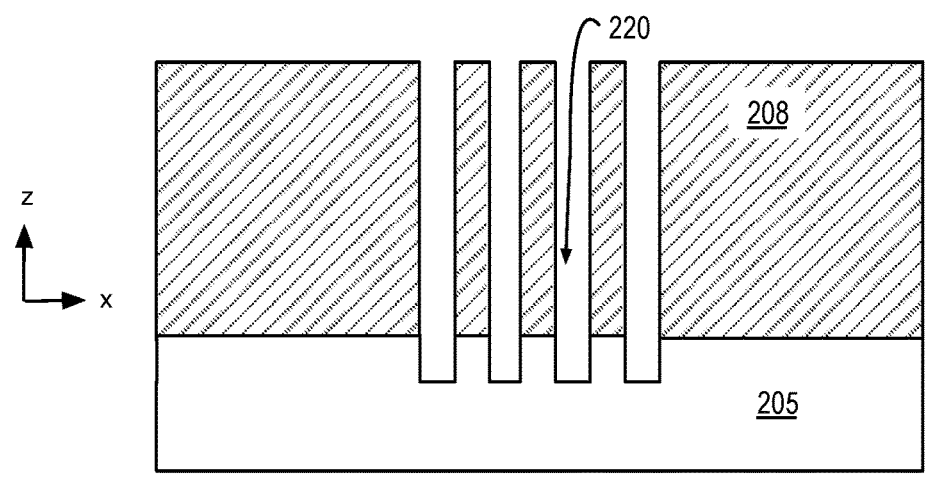
Figure 2C:
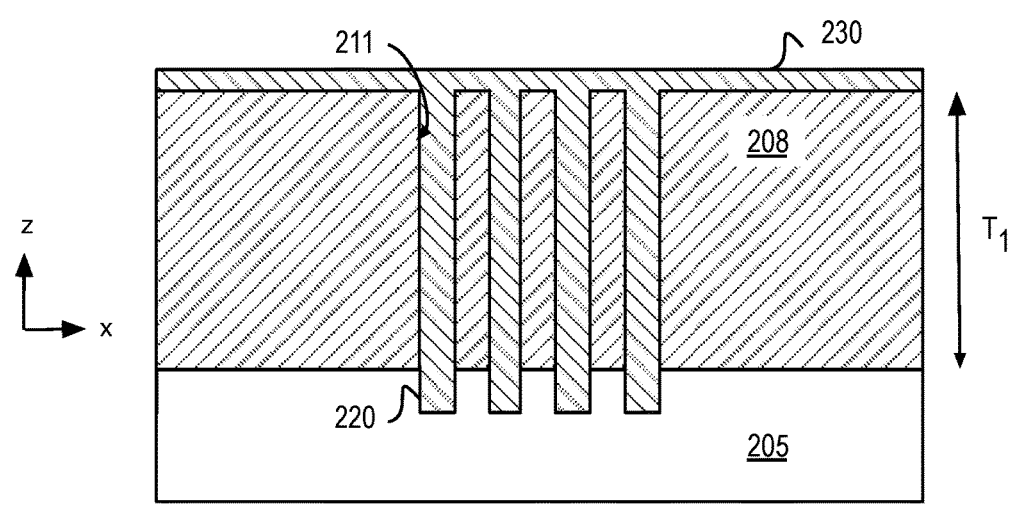

Method 101 continues with etching a pattern in at least a portion of one or more layers at operation 120. Etching operation 120 transfers the features of the patterned mask into a material layer disposed below the patterned mask. Embodiments herein are not limited with respect to the etch process employed and any suitable etch technique (dry/plasma etch, wet chemical etch, ion milling, etc.) may be utilized as a function of the composition of the material to be removed and other typical constraints. As shown in FIG. 2B, the etch operation 120 transfers mask features 211 into substrate layer 205, forming substrate features 220.

Subsequent to transferring the mask pattern into an underlying material layer, method 101 continues with operation 130 where pattern features are backfilled with a sacrificial backfill material. The backfilling operation 130 may merely coat surfaces of an etched feature with the sacrificial backfill material or may completely fill in an etched feature with the sacrificial backfilling material. In the exemplary embodiment depicted in FIG. 2C, sacrificial backfill material 230 completely fills the etched features 220, completely fills the mask features 211, and covers a top surface of mask 208. In this embodiment, sacrificial backfill material 230 planarizes over the mask 208. As described further below, such a planarized surface has advantages, but alternative embodiments may not achieve such planarization (e.g., where mask features are not completely backfilled). Such embodiments may still be successful depending on other constraints/limitations of the various other operations in method 101 (e.g., etch selectivities and relative material layer thicknesses). In certain planarized embodiments, sacrificial backfill material is dispensed at operation 130 with a spin-on coat process. In other embodiments, a low temperature (e.g., <300° C.) chemical vapor deposition (CVD) process or plasma-enhanced CVD (PECVD) process may be employed at operation 130.

In embodiments, the sacrificial backfill material is to protect the substrate layer features patterned at operation 120 during subsequent removal of at least a portion of the patterned etch mask. In this manner, the process by which the patterned mask is removed, as required by the mask composition, may be effectively exchanged for a more gentle process, as required by the sacrificial backfill material. In further embodiments, the sacrificial backfill material is also more removable than is at least a portion of the etch mask. Hence, relative to at least a portion of the etch mask, the sacrificial backfill material applied at operation 130 may be of a material that can be removed with greater selectivity over the etched material layer such that its subsequent removal is less damaging to the etched features.

In certain embodiments, the sacrificial backfilling material may be of any material composition that offers sufficient protection of the etch features and can nevertheless be readily removed. Exemplary materials include both photo-definable and non-photo-definable materials, and in certain such embodiments, any of the photo-definable and non-photo-definable materials described above for the etch mask may be utilized. Notably, even for embodiments where the etch mask is of homogeneous composition and the sacrificial backfilling material is of the same composition as the etch mask, the substrate patterning etch may still be advantageously decoupled from the mask removal through reduction or elimination of the delta in the time a patterned substrate feature surface is exposed to a mask removal process relative to a non-patterned portion of the substrate layer. Indeed, the exposure time delta may be made negative where the sacrificial material withstands complete removal of the etch mask. Further advantage may be realized where at least a portion of the etch mask is compositional differentiated from the sacrificial backfill material. In one such embodiment, the etch mask has undergone a compositional change from the as-deposited state rendering it relative more difficult to remove than the sacrificial backfilling material. For example, the etch mask material layer(s) may have become hardened by the mask patterning process or through exposure to the etch process employed to pattern the substrate layer. In still other embodiments, as described further below, advantageous compositional differentiation between the etch mask and the sacrificial backfill material may be achieved where the etch mask includes multiple masking material layers (e.g., silicon-containing photoresist over a non-silicon photoresist, or a first hard mask material disposed over a second hard mask material, etc.).

Figure 2D:
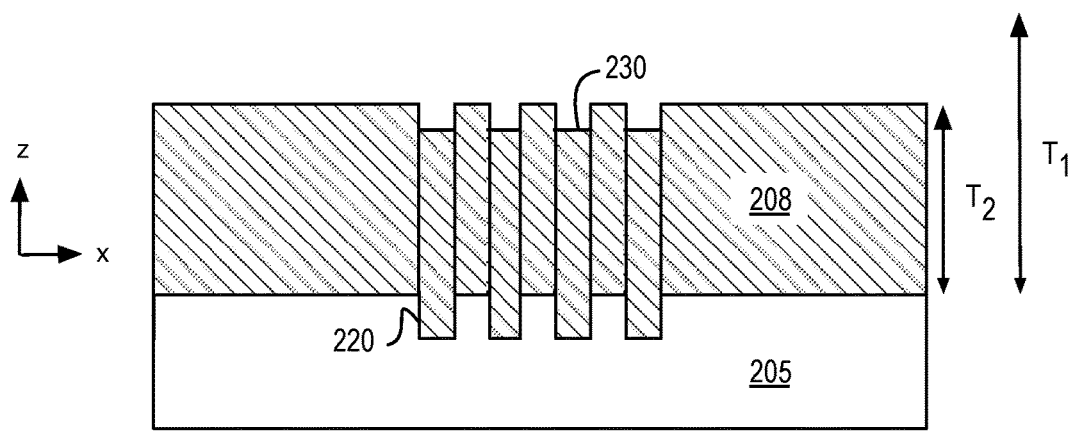
Figure 2E:
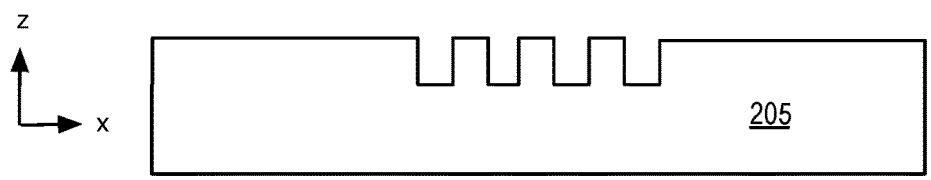

Returning to FIG. 1, method 101 continues with removing at least a top portion of the etch mask at operation 140. Any mask removal process may be performed at operation 140, as dependent on the particular composition of the etch mask. For example, any plasma etch/ash, wet etch, solvent strip, or acid clean may be performed to remove some or all of the etch mask. FIG. 2D illustrates an exemplary embodiment where a top thickness of sacrificial backfill material 230 has been removed to expose a top surface of etch mask 208. The thickness of etch mask 208 is also reduced from a post-substrate etch thickness $T_1$, depicted in FIGS. 2C and 2D, to a post-mask etch-back thickness of $T_2$, depicted in FIG. 2D. As shown in FIG. 2D, the planarized surface of sacrificial backfill material 230 enables an etch-back process to remove a relatively consistent top thickness of etch mask 208 (e.g., $T_1$-$T_2$) while etch substrate features 220 remain protected from the mask etch-back process. Notably, the mask removal process employed at operation 140 may etch the sacrificial backfill material at any rate above or below that of the etch mask. For example, recessing of sacrificial backfill material 230 below a top surface of etch mask 208 in the exemplary embodiment depicted in FIG. 2D indicates that the etch rate of sacrificial backfill material 230 was greater than that of the top portion of etch mask 208. In certain embodiments, the mask removal process employed at operation 140 may etch-back the sacrificial backfill material at a rate five times or more than the rate at which a top mask material is etched. Tolerance to a given etch selectivity between the sacrificial backfill material and the etch mask is a function of the relative film thicknesses and is therefore as an implementation detail left to one of ordinary skill in the art.

With at least a top portion of the etch mask removed, method 101 proceeds to operation 150 where any remainder of the sacrificial backfill material is stripped selectively relative to the layer that was etched at operation 120. For embodiments where only a portion of the etch mask was removed at operation 140, the remainder of the etch mask is also removed at operation 150. Any mask removal process may be performed at operation 150, as dependent on the particular composition of the etch mask. For example, any plasma etch/ash, wet etch, solvent strip, or acid clean may be enlisted to remove the sacrificial backfill material (and remaining etch mask). In some embodiments, the same mask removal process employed at operation 140 is repeated at operation 150. For such an embodiment, benefit is achieved at least through a reduction thickness of the etch mask prior to exposing the layer etched at operation 120 to any stripping process. In embodiments where removal of the top portion of the etch mask further enables a different stripping process at operation 150 than that employed at operation 140, the features etched at operation 120 may receive all the more benefit of a more gentle stripping process.

Method 101 concludes with completing the device fabrication at operation 160, which may entail any conventional processing associated with the particular device, whether it is an integrated circuit (IC), microelectromechanical system (MEMS), optical/photonic device, or other nano-scale integrated device.

Figure 3:
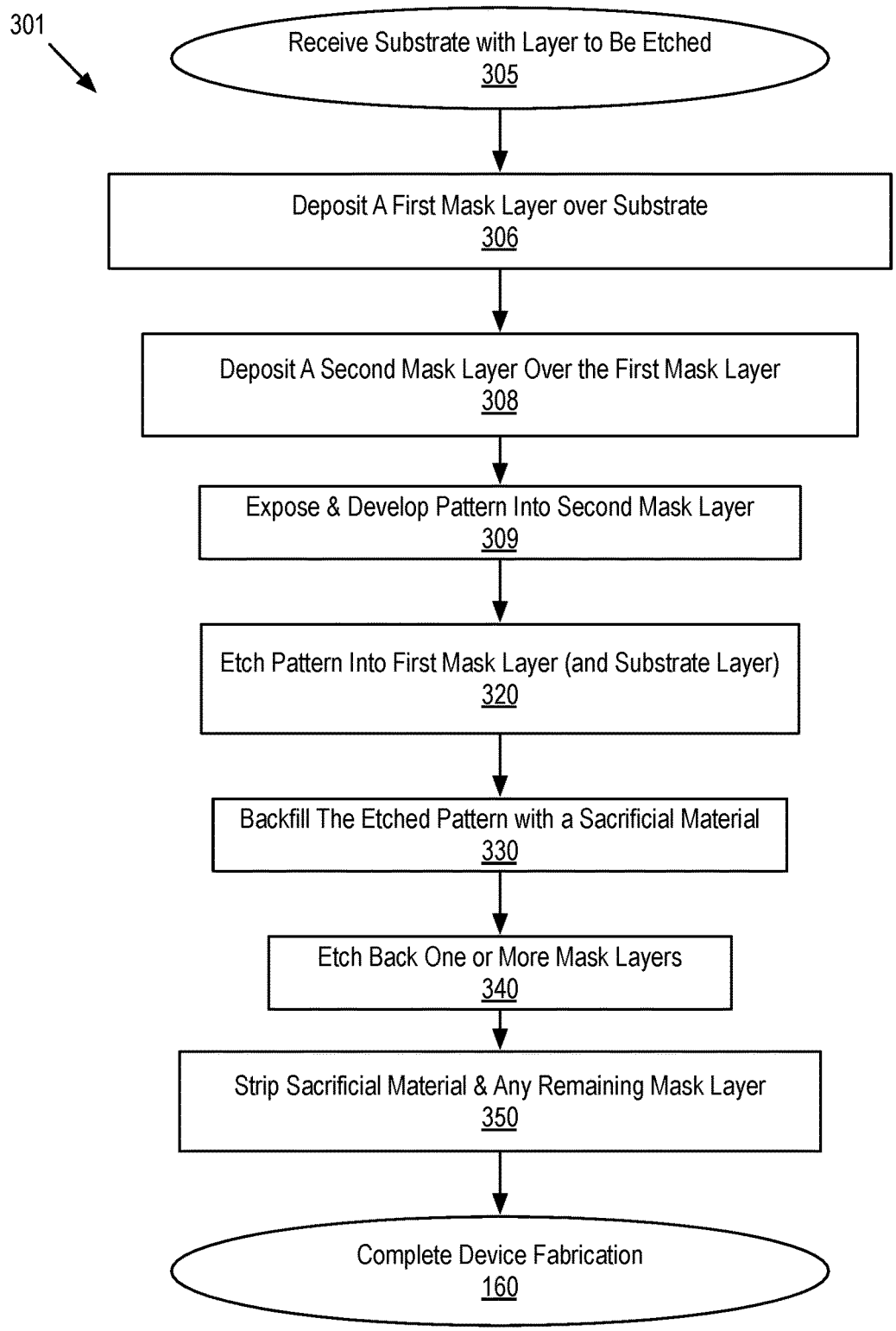
FIG. 3 is a flow diagram illustrating a method of stripping a multi-layered etch mask from a substrate with a sacrificial material, in accordance with and embodiment.

FIG. 3 is a flow diagram illustrating a method 301 for stripping a multi-layered etch mask from a substrate with a sacrificial material, in accordance with and embodiment. Method 301 is a specific embodiment of method 101 in which the etch mask entails a stack of compositionally distinct masking material layers. FIGS. 4A, 4B, 4C, 4D, 4E, 4F, 4G, and 4H are cross-sectional views of an integrated device structure evolving as selected operations in method 301 are performed, in accordance with an embodiment.

Referring first to FIG. 3, method 301 begins at operation 305 where a substrate with a layer to be etched is received. The substrate layer may be any of those described above in the context of substrate 205 and/or method 101. In a particular embodiment depicted in FIG. 4A, substrate layer 205 includes a dielectric thin film, such as a silicon containing material (e.g., $SiO_2$, $Si_xO_y$, $Si_3N_4$, SiC, etc.) exposed on a working surface. Method 301 proceeds to operation 306 where a first mask layer is deposited over the substrate layer. In one such embodiment, the first mask layer includes a non-photo-definable hard mask layer deposited over the substrate layer. Such a hard mask layer may be any of the materials described above in the context of etch mask 208 and/or method 101. In a particular embodiment depicted in FIG. 4B, hard mask layer 406 is deposited directly (in contact with) substrate layer 205 and is of a composition providing high etch selectivity relative to substrate layer 205. For example, in one embodiment where substrate layer 205 includes a silicon containing material, hard mask layer 406 is substantially silicon free. In a further embodiment, hard mask layer 406 is a carbon-based material, such as a spin-on carbon film or CVD carbon (e.g., diamond-like carbon).

Figure 4A:
FIGS. 4A, 4B, 4C, 4D, 4E, 4F, 4G, and 4H are cross-sectional views of an integrated device structure evolving as selected operations in the method depicted in FIG. 3 are performed, in accordance with an embodiment.
Figure 4B:
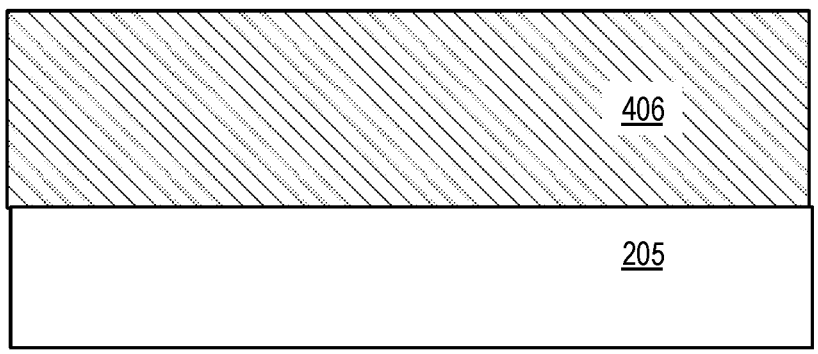
Figure 4C:
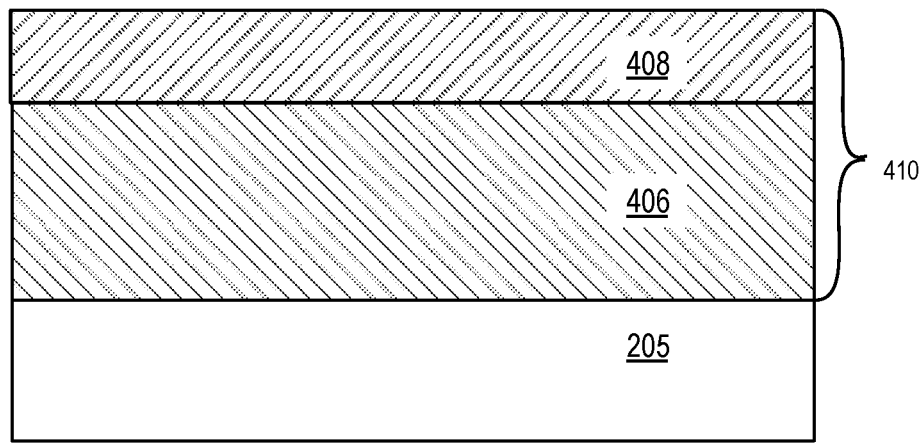
Figure 4D:
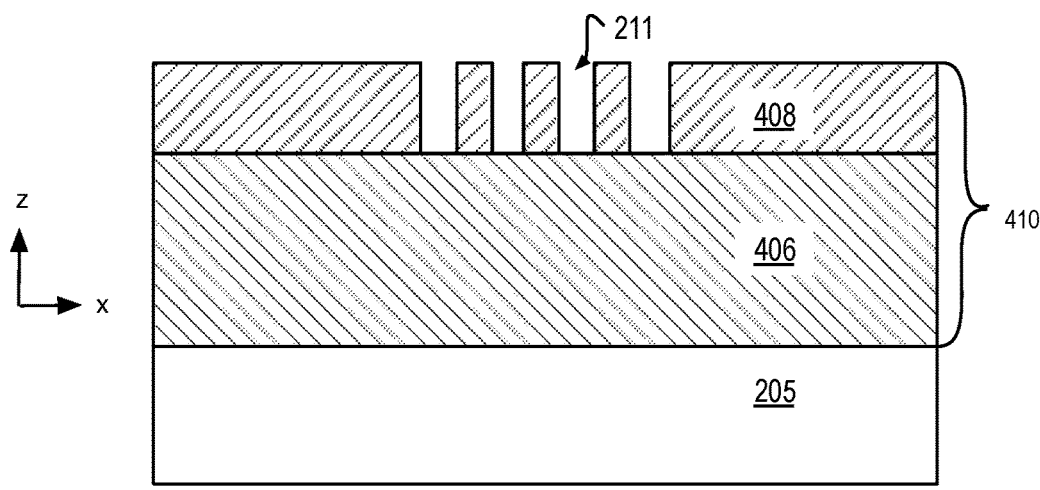
Figure 4E:
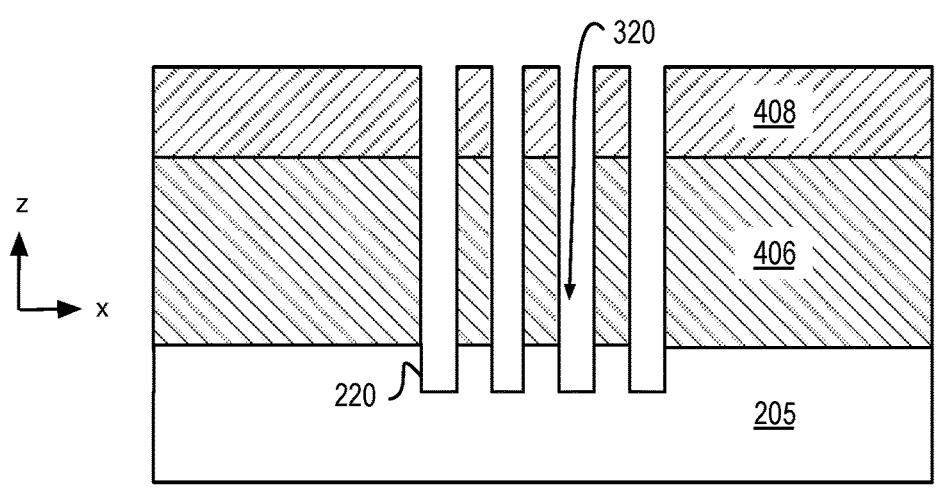
Figure 4F:
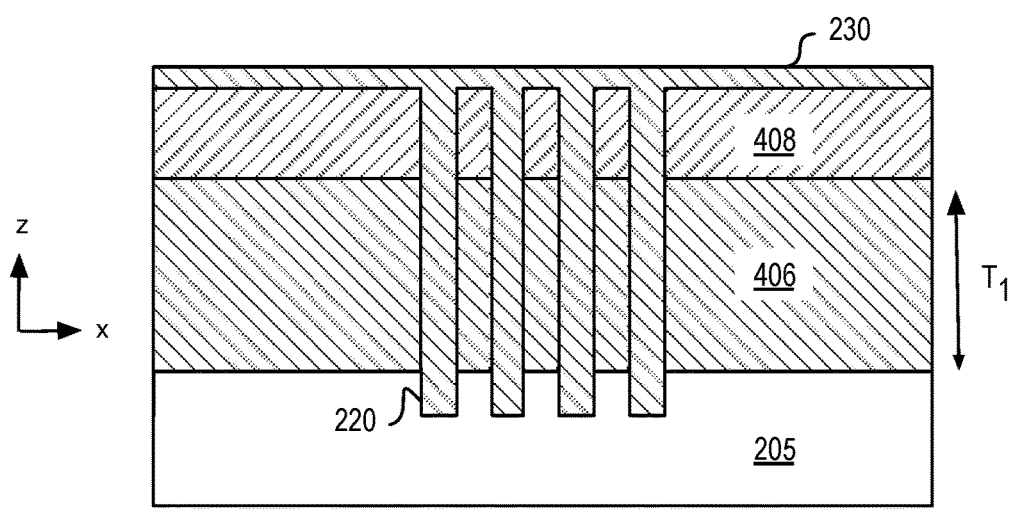
Figure 4G:
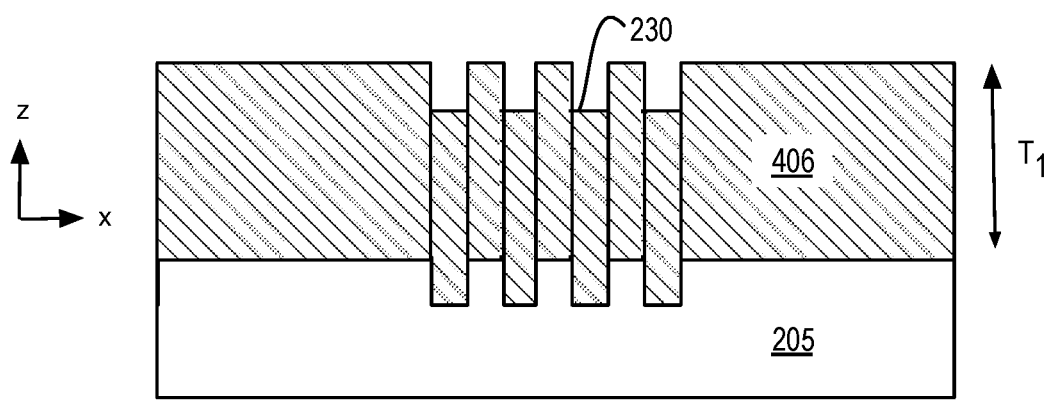

Returning to FIG. 3, method 301 continues with operation 308 where a second etch mask layer is deposited over the first etch mask layer. In one embodiment the second mask material layer includes one or more photo-definable mask material layer. Such a photo-definable mask material layer may be any of the materials described above in the context of etch mask 208 and/or method 101. In a particular embodiment depicted in FIG. 4B, photo-definable mask material layer 408 is any photoresist suitable for a desired feature size and is deposited directly on the hard mask material layer 406. At operation 309, the photo-definable mask material layer is patterned, for example with a predetermined pattern exposed and developed through any process compatible with the particular composition of the photo-definable mask material layer. As shown in FIG. 4D, mask features 211 are printed into photo-definable mask material layer 408, exposing a portion of hard mask material layer 406.

Method 301 proceeds with etching a pattern into the first mask layer to complete patterning of the etch mask at operation 320. In addition, the substrate layer is also etched at operation 320. Etching of the hard mask layer and substrate layer may be either integrated into one continuous process (i.e., in-situ) or multiple discrete processes (ex-situ). Any conventional hard mask layer and substrate layer etch processes may be employed at operation 320 as dependent on the particular composition of the layer. In the exemplary embodiment illustrated in FIG. 4E, operation 320 entails etching a non-silicon containing hard mask material layer 406 with a first plasma process to form mask features 320 that expose regions of the substrate layer 205. Operation 320 further entails etching a silicon-containing substrate material layer 205 with a second plasma process to form substrate features 220.

Returning to FIG. 3, at operation 330, the etched pattern is backfilled with the sacrificial material. The sacrificial backfill material may be any of the materials described above in the context of sacrificial backfill material 230 and/or method 101. In a particular embodiment, the sacrificial backfill material has a composition distinct from the second mask material layer. In a further embodiment, the sacrificial backfill material has the same composition as the first mask material layer that was deposited at operation 306. The sacrificial backfill material may be deposited by any of the techniques described above in the context of sacrificial backfill material 230 and/or method 101. In a particular embodiment depicted in FIG. 4F sacrificial backfill material 230 is applied with a planarizing process to completely fill mask features 320 and to cover a top surface of photo-definable mask material layer 408. In one such embodiment, sacrificial backfill material 230 is applied with a spin-on coating process, which can be performed inexpensively and at low temperatures compatible with most mask materials.

Method 301 proceeds to operation 340 where at least the top layer of a multi-layered etch mask is removed. The etch-back operation 340 is performed while the sacrificial backfill material is covering the features that were etched into the substrate layer at operation 320. Any etch or stripping process may be employed at operation 340 as dependent on the particular composition or microstructural state of the second mask material layer. For embodiments where the sacrificial backfill material is planarized over the top surface of the etch mask, the sacrificial backfill material is first etched back to expose the underlying etch mask. In the exemplary embodiment depicted in FIG. 4G, the photo-definable material layer 408 is removed selectively to the underlying hard mask layer 406 with the etch-back operation 340 also recessing sacrificial backfill material 230. If the stripping operation has high selectivity, the hard mask layer 406 may be very nearly the as-deposited thickness ($T_1$) following operation 340.

Figure 4H:
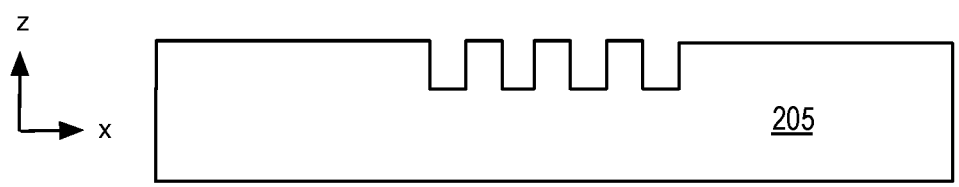

At operation 350, the sacrificial backfill material is stripped along with any remaining masking material layers, for example to arrive at the etched structure depicted in FIG. 4H. Any dry or wet stripping process may be employed at operation 350 depending on the particular composition of the sacrificial backfill material and remaining masking material. In embodiments, both hard mask material layer 406 and sacrificial backfill material 230 are removed selectively over substrate layer 205. In embodiments where the sacrificial backfill material has the same composition as the first mask material layer, the two are stripped concurrently. In alternative embodiments where the sacrificial backfill material has a composition distinct from the first mask material layer, the two may be stripped concurrently or consecutively. In one such embodiment, the sacrificial backfill material is removed subsequent to removal of the first mask material layer to minimize exposure of the etch features to the removal process employed at operation 350.

Method 301 then concludes with completing the device fabrication at operation 160, which may entail any conventional processing associated with the particular device, whether it is an IC, MEMS, optical/photonic device, or other nano-scale integrated device.

Figure 5:
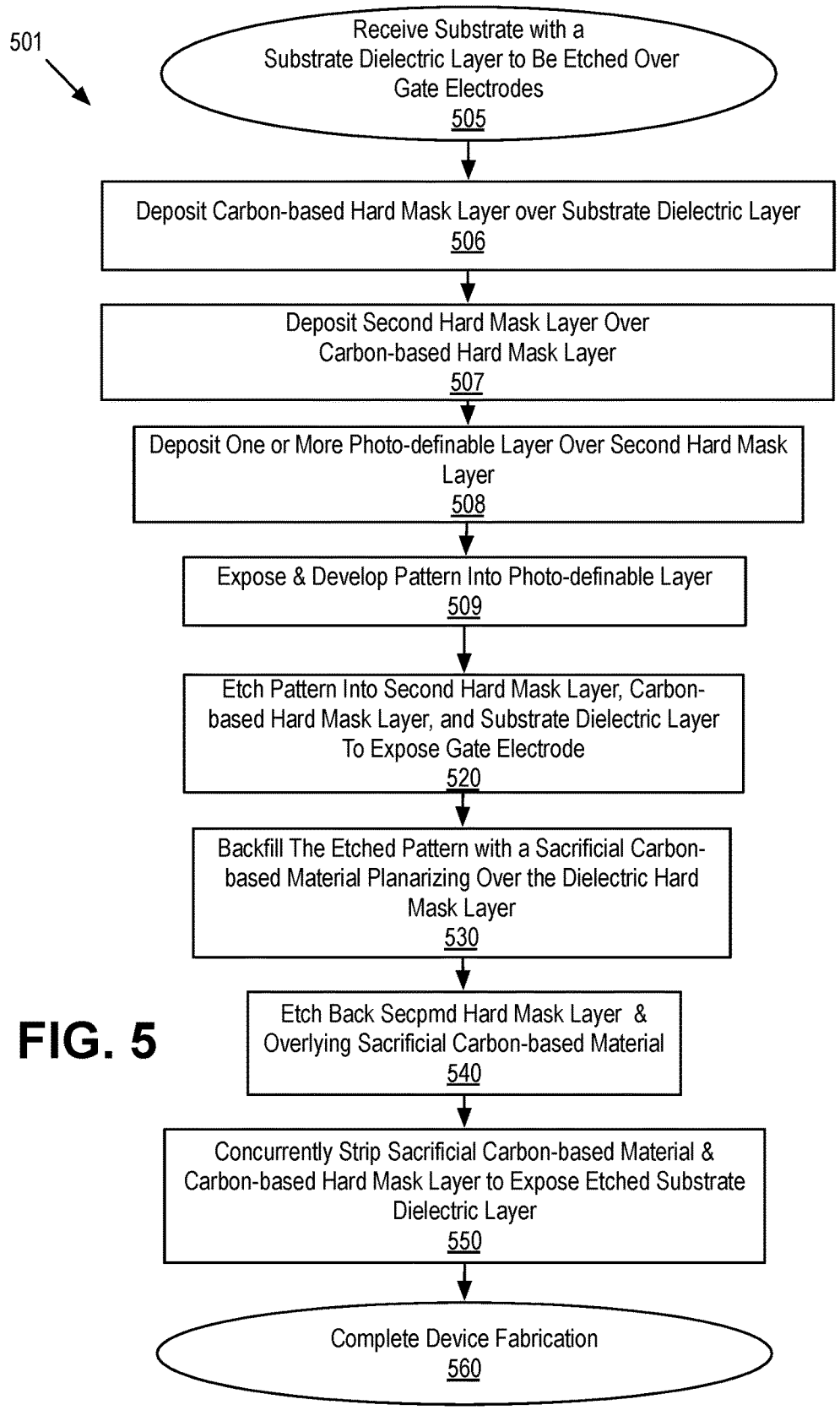
FIG. 5 is a flow diagram illustrating a method of stripping a multi-layered etch mask from a substrate with a sacrificial material, in accordance with a MOSFET gate contact etch embodiment.

FIG. 5 is a flow diagram illustrating a method 501 for stripping a multi-layered etch mask from a substrate with a sacrificial material, in accordance with a MOSFET gate contact etch embodiment. FIGS. 6A, 6B, 6C, 6D, 6E, 6F, 6G, 6H, and 6I are cross-sectional views of an integrated device structure evolving as selected operations in the method depicted in FIG. 5 are performed, in accordance with an exemplary gate contact etch embodiment.

Method 501 begins with receiving a starting material with a substrate dielectric layer disposed over one or more gate electrodes, each associated with a field effect transistor. As further illustrated in FIG. 6A, substrate dielectric layer 605 is disposed directly on gate electrodes 604. Although illustrated as a planarized material layer, substrate dielectric layer 605 may be a conformal layer as well. Any dielectric material may be employed, however in the exemplary embodiment substrate dielectric layer 605 is a silicon-containing dielectric, such as $SiO_2$, $Si_3N_4$, or SiC. Although gate electrodes 604 may have any topology and be of any composition, in the exemplary embodiment, gate electrodes 604 include polysilicon or a metal, such as, but not limited to tungsten, and/or aluminum. In a further embodiment, the gate electrodes have a CD in the x-dimension that is less than 30 nm, advantageously less than 20 nm, and more advantageously less than 15 nm. While embodiments are not necessarily restricted to any particular gate electrode or gate contact CD, advantages of the technique can become more apparent with a smaller CD. For example, feature erosion during a conventional mask strip process that is tolerable at a larger CD may become intolerable at the smaller CD. Furthermore, embodiments with such small CD are noteworthy in that the inventors have found that the applicability of methodologies described herein extends to such small nano-scale features even though one of ordinary skill might presume mask feature collapse (e.g., due to mechanical failure of the more fragile small features) would pose an issue.

At operation 506, a carbon-based hard mask layer is disposed over the substrate dielectric layer. In an exemplary embodiment, the carbon-based hard mask layer is a carbon-based material having at least 70 wt % carbon, advantageously at least 80 wt %, and more advantageously at least 90 wt % carbon. The carbon-based hard mask material may be deposited with a spin-on dispense process or by CVD, for example. In one specific embodiment illustrated in FIG. 6B, a carbon-based hard mask material layer 606 is at least 90 wt % carbon and deposited with a spin-on dispense process. Such a material is commercially available through JSR Corp. of Tokyo, Japan. In the embodiment depicted in FIG. 6B, carbon-based hard mask material layer 606 is disposed directly on substrate dielectric layer 605.

Referring to FIG. 5, at operation 507 a second hard mask material layer is applied over the carbon-based hard mask layer. The second hard mask material layer is of a composition different than that of the carbon-based hard mask layer. In one embodiment, the second hard mask material layer is of a very similar composition, or the same composition, as the substrate dielectric layer. In one exemplary embodiment is a silicon-containing material. Such a material may be deposited by spin-on, low temperature CVD, or any other means conventional to the specific material. In the exemplary embodiment illustrated in FIG. 6D, a silicon-containing dielectric material layer 607 is disposed directly on the carbon-based hard mask material layer 606. In one such embodiment, the silicon-containing dielectric material layer 607 is a silicon-containing anti-reflective coating (Si-ARC) comprising silicon dioxide, silicon oxynitride, and/or silicon nitride, and/or silicon carbide (SiC), which may be doped, for example with oxygen.

Figure 6A:
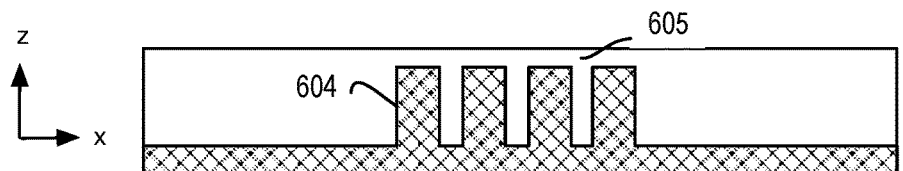
FIGS. 6A, 6B, 6C, 6D, 6E, 6F, 6G, 6H, and 6I are cross-sectional views of a MOSFET gate contact structure evolving as selected operations in the method depicted in FIG. 5 are performed, in accordance with an embodiment.
Figure 6B:
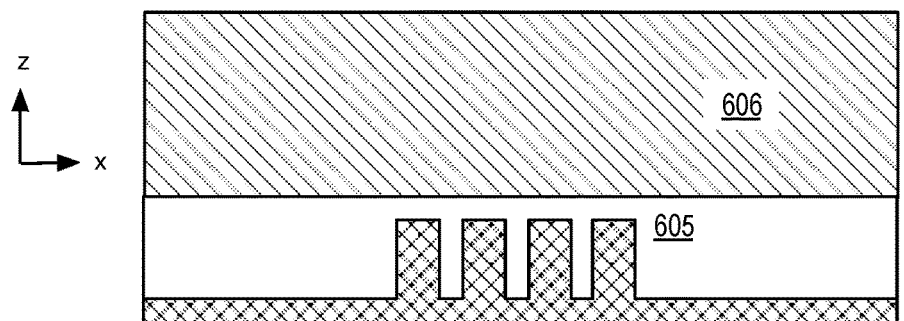
Figure 6C:
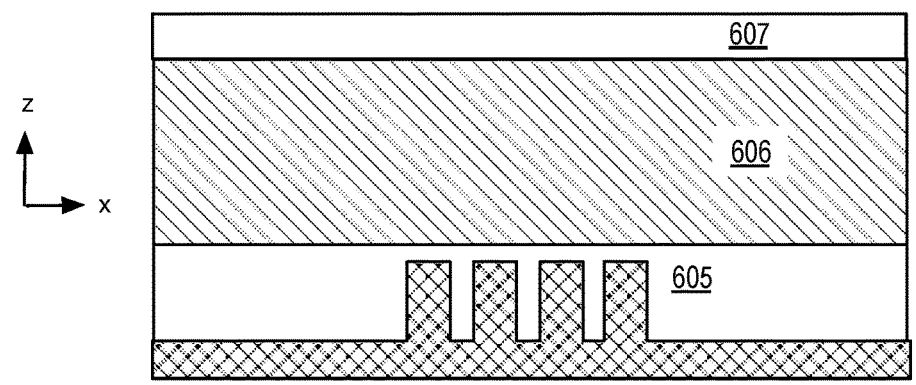
Figure 6D:
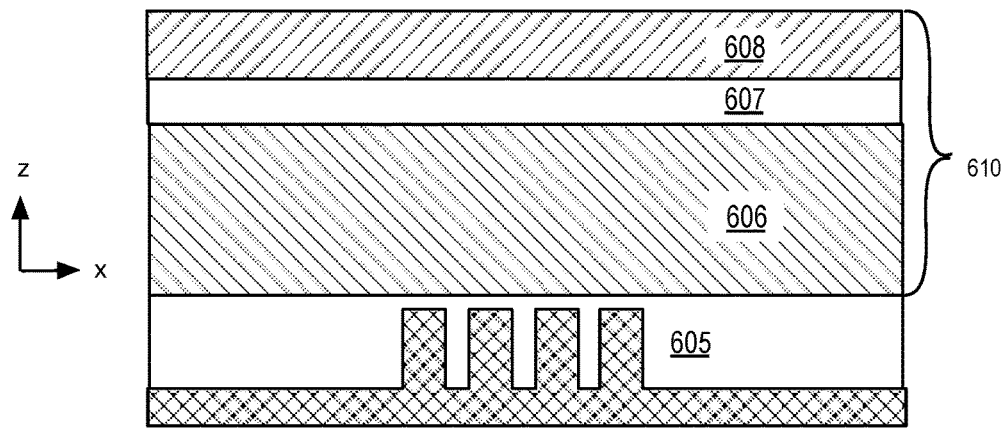
Figure 6E:
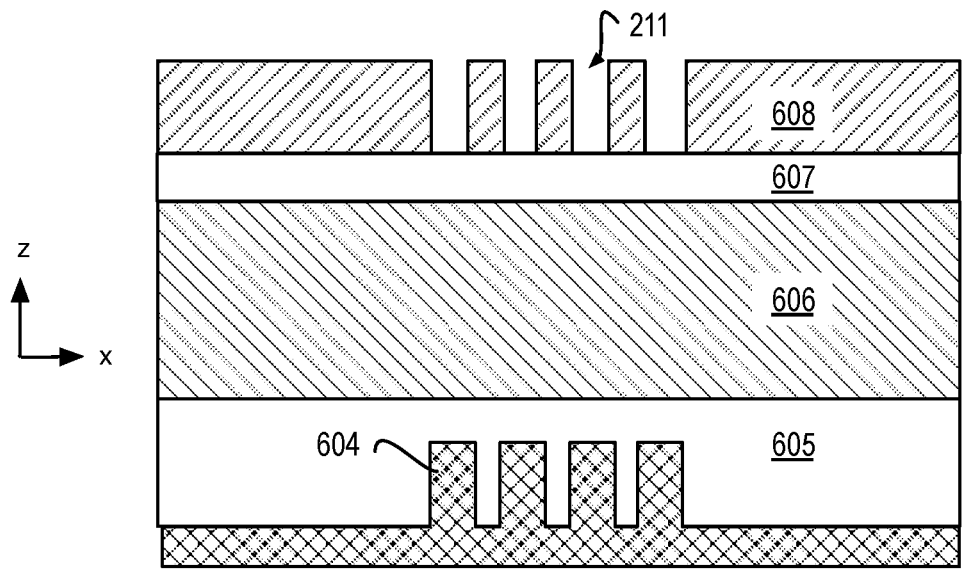
Figure 6F:
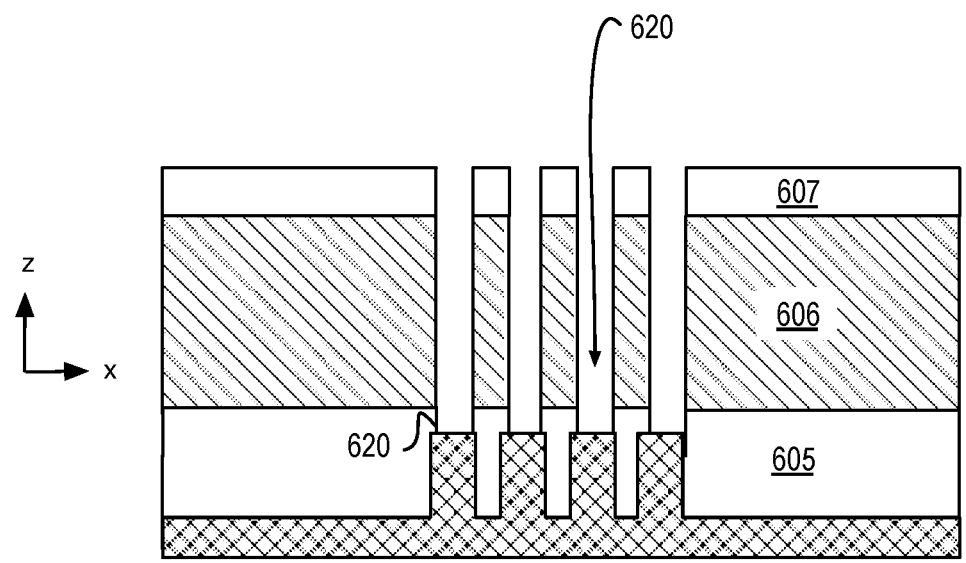
Figure 6G:
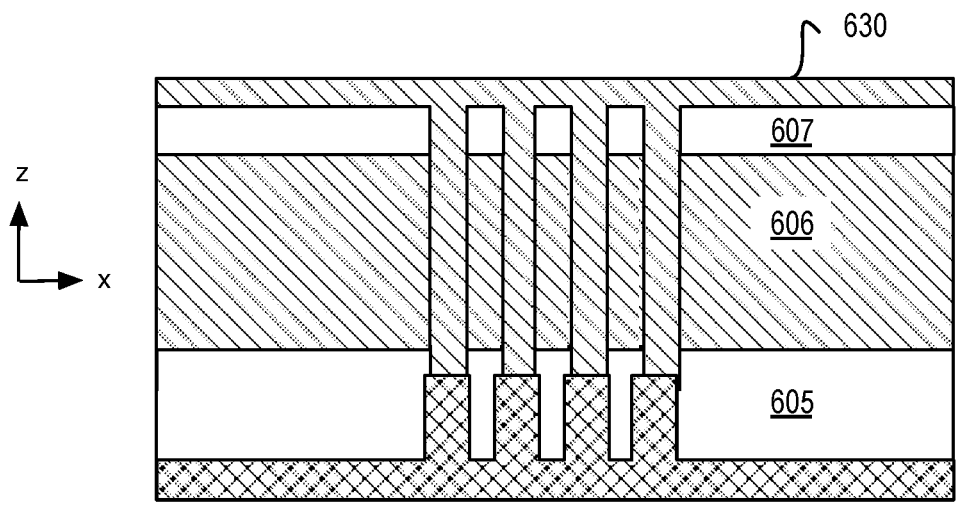
Figure 6H:
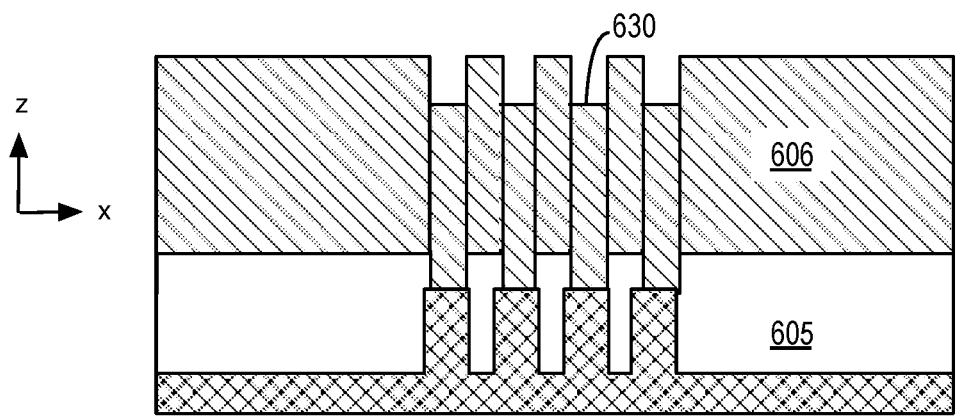
Figure 6I:
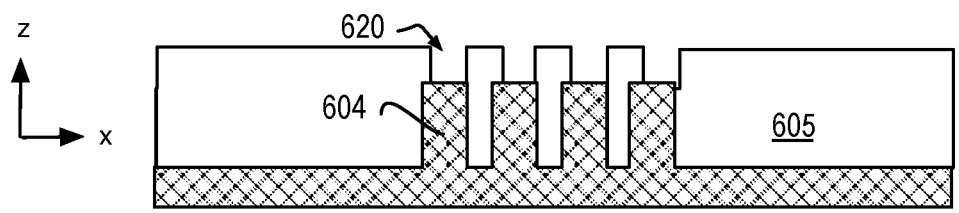

At operation 508, one or more photo-definable mask material layer is deposited over the second hard mask layer. Notably, one or more additional non-photo-definable layers may be deposited over the second hard mask layer before the photo-definable hard mask layer. For example an organic BARC layer may be deposited directly on the second hard mask layer and the photo-definable mask material layer then deposited directly on the BARC layer. Any photoresist may be applied at operation 508. In the exemplary embodiment, a photoresist layer 608 is deposited over silicon-containing dielectric material layer 607 to form multi-layered mask 610. At operation 509 the photo-definable layer is then patterned by any suitable technique, such as but not limited to a photolithographic process including exposure and develop operations. As depicted in FIG. 6E, mask features 211 are printed into photoresist layer 608. In the exemplary gate contact embodiment, mask features 211 are openings having a CD in the x-dimension of less than 50 nm, and advantageously between 20-50 nm, or smaller. As depicted in FIG. 6E, mask features 211 are aligned over gate electrodes 604. In certain embodiments, two separate photo-definable mask material layers are successively applied and patterned following any conventional double patterning methodology to arrive at a composite pattern having mask features 211.

Method 501 then proceeds to operation 520, where a pattern is etched into the second hard mask layer, carbon-based hard mask layer, and substrate dielectric layer to expose a top surface of one or more gate electrode. One or more etch processes may be employed to clear the hard mask material layers. In the exemplary embodiment depicted in FIG. 6F, one or more anisotropic plasma etch process is employed to form mask features 320. In one such embodiment, a first plasma etch process is employed to clear Si-containing dielectric mask material layer 607 (and any overlying BARC layer) to expose carbon-based hard mask material layer 606. A subsequent anisotropic plasma etch process is then employed to transfer mask features 320 into carbon-based hard mask layer 606 using any plasma etch process suitable for high aspect ratio etching of carbon films. A subsequent anisotropic plasma etch process is then employed to transfer mask features 211 into silicon-containing substrate dielectric layer 605 to form one or more gate contact opening 620 exposing one or more gate electrode 604. As further depicted in FIG. 6F, the pattern etching operation 520 may advantageously consume the entire thickness of photoresist layer 608 (and any underlying BARC layer) so that silicon-containing dielectric mask material 607 becomes the top surface of the remaining mask. At this point in method 501, the multi-layered mask 410 is a bi-layer mask comprising silicon-containing dielectric material 607 disposed on carbon-based hard mask layer 606.

Method 501 continues with operation 530 where the etched pattern is backfilled with a sacrificial carbon-based material. In the exemplary embodiment depicted in FIG. 6G, a sacrificial carbon-based material layer 630 planarizes over silicon-containing dielectric material layer 607 and substantially fills mask features 320. In particularly advantageous embodiments, sacrificial carbon-based material layer 630 has the same composition as carbon-based hard mask material layer 606. In certain such embodiments, sacrificial carbon-based material layer 630 is applied with a spin-on process for good planarization and contains at least 70 wt % carbon, advantageously at least 80 wt % carbon, and more advantageously at least 90 wt % carbon.

Subsequently, with the sacrificial carbon-based material protecting the substrate dielectric layer, method 501 proceeds to operation 540 where the second hard mask material layer (and any overlying sacrificial carbon-based material) is completely removed with an etch-back process. In the exemplary embodiment illustrated in FIG. 6I where substrate dielectric layer 605 contains silicon, fabrication constraints relating to removal of silicon-containing dielectric material layer 607 selectively over a gate contact opening 620 are eliminated with sacrificial carbon-based material layer 630 protecting the gate contact opening 620. As such, the pattern etch operation 520 need not be further tasked with completely consuming silicon-containing dielectric material layer 607. Etch-back of sacrificial carbon-based material layer 630 may be performed with any suitable process, such as a plasma etch process similar to that employed to pattern carbon-based hard mask material layer 606 at operation 520. In the exemplary embodiment the etch-back etches sacrificial carbon-based material layer 630 faster than silicon-containing dielectric material layer 607 and so has a top surface recessed below a top surface of carbon-based hard mask material layer 606.

Following removal of silicon-containing dielectric material layer 607, method 501 proceeds to operation 550 where the sacrificial carbon-based backfill material and carbon-based hard mask material layer are stripped substantially concurrently (i.e., with a same removal process). In the exemplary embodiment where both sacrificial carbon-based material layer 630 and carbon-based hard mask material layer 606 are of a same material, a single strip process, such as an oxidizing plasma ash is performed at operation 550 to expose the contact openings 620 and one or more gate electrodes 604.

Method 501 then concludes with completing the device fabrication at operation 560, which may entail any conventional processing associated with an IC including at least one MOSFET that utilizes the one or more gate electrodes.

Figure 7:
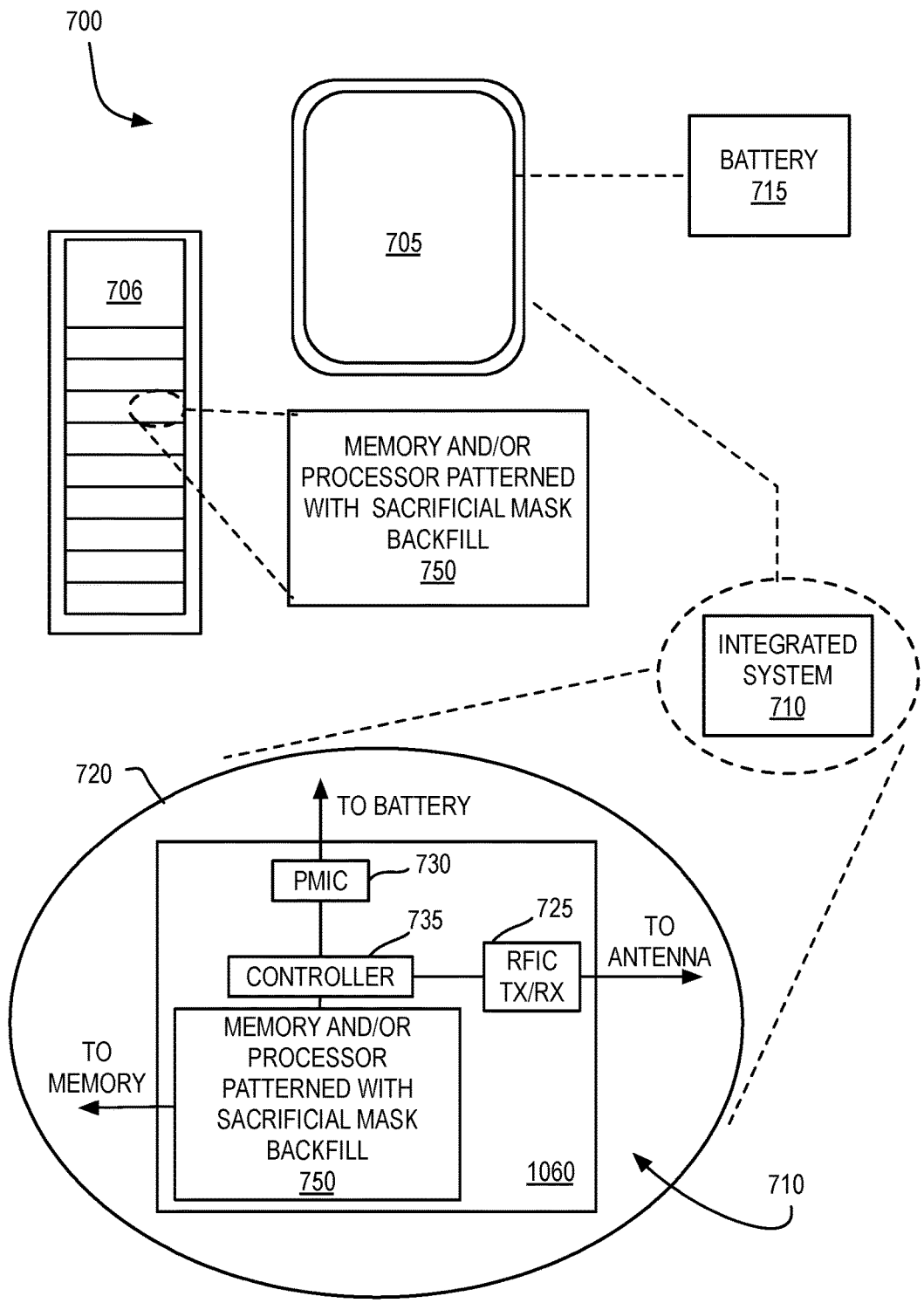
FIG. 7 illustrates a mobile computing platform and a data server machine employing a monolithic IC patterned, at least in part, with a sacrificial mask backfill method in accordance with embodiments of the present invention.

FIG. 7 illustrates a system 700 in which a mobile computing platform 705 and/or a data server machine 706 employs a monolithic IC that has been patterned at least once in a manner that employs a sacrificial mask backfill, in accordance with embodiments of the present invention. The server machine 706 may be any commercial server, for example including any number of high performance computing platforms disposed within a rack and networked together for electronic data processing, which in the exemplary embodiment includes a packaged monolithic IC 750. The mobile computing platform 705 may be any portable device configured for each of electronic data display, electronic data processing, wireless electronic data transmission, or the like. For example, the mobile computing platform 705 may be any of a tablet, a smart phone, laptop computer, etc., and may include a display screen (e.g., a capacitive, inductive, resistive, touchscreen), a chip-level or package-level integrated system 710, and a battery 715.

Whether disposed within the integrated system 710 illustrated in the expanded view 720, or as a stand-alone packaged chip within the server machine 706, packaged monolithic IC 750 includes a memory chip (e.g., RAM), or a processor chip (e.g., a microprocessor, a multi-core microprocessor, graphics processor, or the like) employing a monolithic architecture that has been patterned at least once with in a manner that employs a sacrificial mask backfill, and advantageously includes a gate contact architecture with at least one gate contact that has been patterned in a manner that employs a sacrificial mask backfill. The monolithic IC 750 may be further coupled to a board, a substrate, or an interposer 760 along with, one or more of a power management integrated circuit (PMIC) 730, RF (wireless) integrated circuit (RFIC) 725 including a wideband RF (wireless) transmitter and/or receiver (TX/RX) (e.g., including a digital baseband and an analog front end module further comprises a power amplifier on a transmit path and a low noise amplifier on a receive path), and a controller thereof 735.

Functionally, PMIC 730 may perform battery power regulation, DC-to-DC conversion, etc., and so has an input coupled to battery 715 and with an output providing a current supply to other functional modules. As further illustrated, in the exemplary embodiment, RFIC 725 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 1050 or within a single IC coupled to the package substrate of the monolithic IC 1050.

Figure 8:
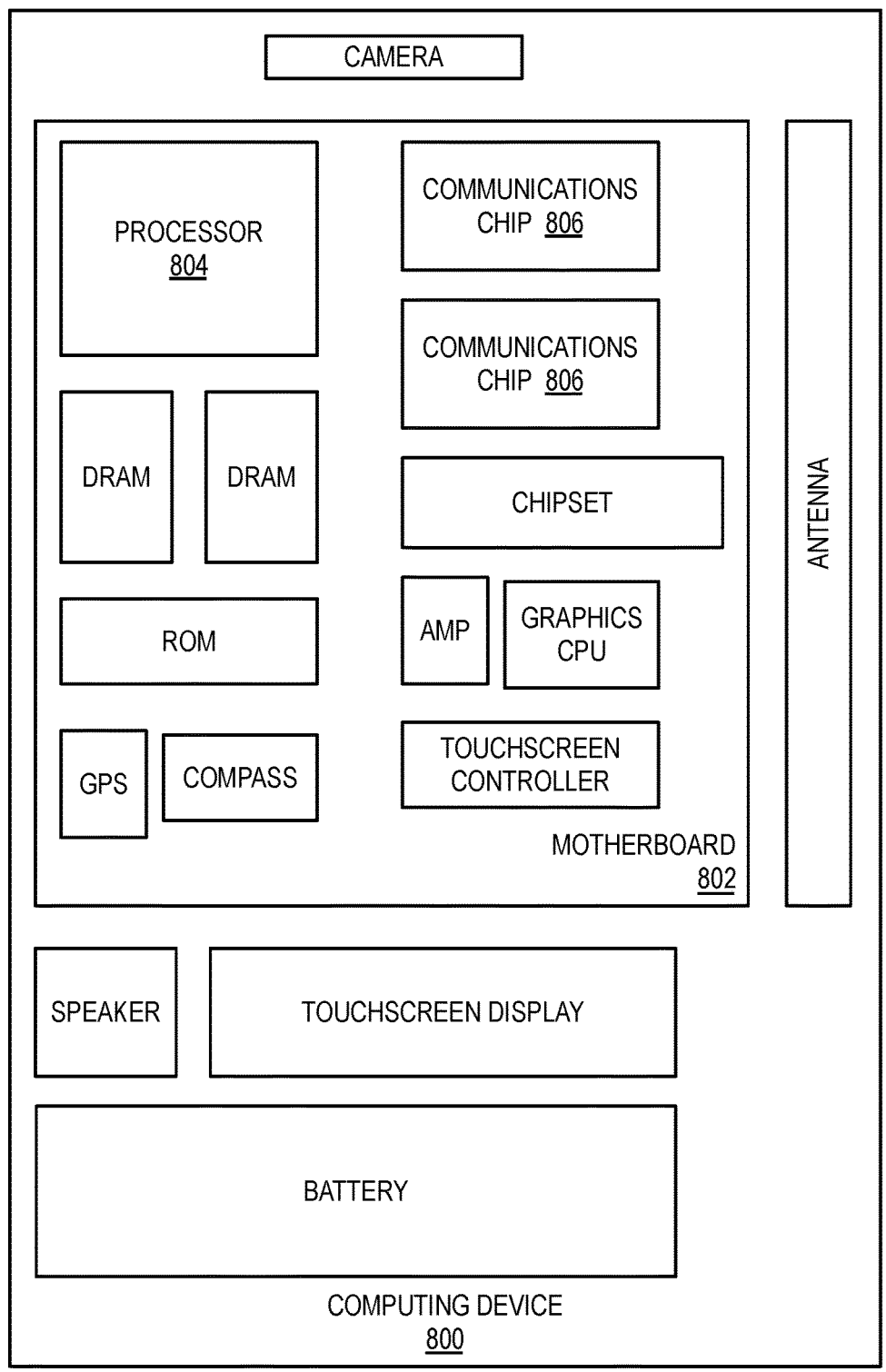
FIG. 8 is a functional block diagram of an electronic computing device, in accordance with an embodiment of the present invention.

FIG. 8 is a functional block diagram of a computing device 800, arranged in accordance with at least some implementations of the present disclosure. Computing device 800 may be found inside platform 805 or server machine 806, for example, and further includes a motherboard 802 hosting a number of components, such as but not limited to a processor 804 (e.g., an applications processor), which may incorporate local inter-level interconnects as discussed herein, and at least one communication chip 806. In embodiments, at least one of the processor 804 one or more communication chips 806, or the like. Processor 804 may be physically and/or electrically coupled to motherboard 802. In some examples, processor 804 includes an integrated circuit die packaged within the processor 804. In general, the term "processor" or "microprocessor" may refer to any device or portion of a device that processes electronic data from registers and/or memory to transform that electronic data into other electronic data that may be stored in registers and/or memory.

In various examples, one or more communication chips 806 may also be physically and/or electrically coupled to the motherboard 802. In further implementations, communication chips 806 may be part of processor 804. Depending on its applications, computing device 800 may include other components that may or may not be physically and electrically coupled to motherboard 802. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 806 may implement any of a number of wireless standards or protocols, including but not limited to those described elsewhere herein. As discussed, computing device 800 may include a plurality of communication chips 806. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. The above embodiments may include specific combination of features. For example:

In one embodiment, a method of fabricating an integrated device includes receiving a substrate with a patterned mask, etching a pattern in at least a portion of one or more layers, backfilling the etched pattern with a sacrificial material, removing at least a top portion of the mask with the scarification material present, and removing a remainder of the sacrificial material selectively to the patterned one or more layers.

In a further embodiment, etching the pattern in one or more layers further comprises etching a layer of the substrate disposed below the patterned mask. Backfilling the etched pattern further comprises filling the pattern in the mask with the sacrificial material completely covering the etched substrate layer, and planarizing the sacrificial material over a top surface of the mask. Removing the top portion of the mask further comprises etching through the entire thickness of the sacrificial material disposed over the top surface of the mask, and etching through only a partial thickness of the mask, and removing a remainder of the sacrificial material also removes remaining mask material.

In a further embodiment, the mask comprises multiple masking material layers, including a first mask material layer disposed under a second mask material layer of different composition than the first mask material layer. Etching the pattern in one or more layers further comprises etching a layer of the substrate disposed below the mask. Backfilling the etched pattern further comprises filling the pattern in the mask with the sacrificial material completely covering the etched substrate layer. Removing the top portion of the mask further comprises etching through at least the second mask material layer, and removing a remainder of the sacrificial material also removes the first mask material layer.

In a further embodiment, the mask comprises multiple masking material layers, including a first mask material layer disposed under a second mask material layer of different composition than the first mask material layer. Etching the pattern in one or more layers further comprises etching a layer of the substrate disposed below the mask. Backfilling the etched pattern further comprises filling the pattern in the mask with the sacrificial material completely covering the etched substrate layer, wherein the sacrificial material has the same composition as the first mask material layer. Removing the top portion of the mask further comprises etching through at least the second mask material layer, and removing a remainder of the sacrificial material also removes the first mask material layer.

In a further embodiment, the mask comprises multiple masking material layers, including a first mask material layer disposed under a second mask material layer of different composition than the first mask material layer. Etching the pattern in one or more layers further comprises etching a layer of the substrate disposed below the mask, wherein the etched substrate layer has the same composition as the second mask material layer. Backfilling the etched pattern further comprises filling the pattern in the mask with the sacrificial material completely covering the etched substrate layer, wherein the sacrificial material has the same composition as the first mask material layer. Removing the top portion of the mask further comprises etching through at least the second mask material layer, and removing a remainder of the sacrificial material also removes the first mask material layer.

In a further embodiment, the mask comprises multiple masking material layers, including one or more photo-definable mask material layers disposed over one or more non-photo-definable hard mask material layers. Etching the pattern in one or more layers further comprises etching through the one or more hard mask material layers, and etching a layer of the substrate disposed below the patterned mask. Backfilling the etched pattern further comprises filling the pattern in the mask with the sacrificial material to completely cover the etched substrate layer, and removing the top portion of the mask further comprises etching through at least one of the hard mask material layers.

In an embodiment, a method of fabricating an integrated microelectronic device includes receiving a substrate with a mask having multiple masking material layers, the mask including one or more patterned photo-definable mask material layers disposed over a plurality of unpatterned non-photo-definable hard mask material layers, the plurality or hard mask layers further including a first hard mask material layer disposed below a second hard mask material layer. The hard mask material layers are patterned by etching through the plurality of hard mask material layers. The substrate is patterned by etching at least a portion of a substrate layer disposed below the first hard mask material layer. The etched pattern is backfilled with a sacrificial material completely covering the etched substrate layer. The second hard mask material layer is etched through while the sacrificial material is present, with the etching terminated on the first hard mask material layer. A remainder of the sacrificial material and the first hard mask material layer is then removed concurrently and selectively relative to the substrate layer.

In a further embodiment, the method includes forming a plurality of transistor gate electrodes on the substrate, and depositing the substrate layer over the gate electrodes. Patterning the substrate further comprises forming a gate contact opening in the substrate layer over at least one of the gate electrodes by etching through the substrate layer to expose a top surface of the gate electrode.

In a further embodiment, backfilling the etched pattern with the sacrificial material further comprises planarizing the sacrificial material over a top surface of the mask; and the method further comprises etching through the entire thickness of the sacrificial material disposed over the top surface of the mask.

In a further embodiment, backfilling the etched pattern with the sacrificial material further comprises applying a carbon-based material with a spin-on process, and etching through the second hard mask material layer comprises etching the carbon-based material at a rate at least equal to etch rate of the second hard mask material layer.

In a further embodiment, backfilling the etched pattern with the sacrificial material further comprises applying the sacrificial material with a spin-on process, and the sacrificial material has the same composition as the first hard mask material layer.

In a further embodiment, the substrate layer is a silicon-containing dielectric material. The first hard mask material layer is a carbon-based material deposited on the substrate layer, the carbon-based material having more than 80 wt % carbon. The second hard mask material layer is a silicon-containing dielectric material and is deposited on the first hard mask material layer. Backfilling the etched pattern with the sacrificial material further comprises applying the carbon-based material over the etched mask materials with a spin-on process.

In a further embodiment, the substrate layer is SiC. The first hard mask material layer is a carbon-based material deposited on the substrate layer, the carbon-based material having more than 80 wt % carbon. The second hard mask material layer is a silicon-containing dielectric material and is deposited on the first hard mask material layer. Backfilling the etched pattern with the sacrificial material further comprises applying the carbon-based material over the etched mask materials with a spin-on process.

In an embodiment, a microelectronic device structure includes a patterned substrate layer having patterned substrate features, a patterned mask disposed over the patterned substrate layer, the mask including a first hard mask material layer of a first composition that is patterned with mask features aligned to the substrate features, and a sacrificial material disposed over the substrate features and backfilling the mask features, wherein the sacrificial material and the first hard mask material are of the same carbon-based non-photo-definable material.

In a further embodiment embodiment, the patterned substrate layer comprises one or more gate contact opening passing through the substrate layer and exposing a top surface of a transistor gate electrode.

In a further embodiment embodiment, a second hard mask material layer of a second composition is disposed over the first hard mask material layer, wherein the second hard mask material layer is also patterned with the mask features.

In a further embodiment, a second hard mask material layer of a second composition is disposed over the first hard mask material layer. The second hard mask material layer is also patterned with the mask features, and the patterned substrate layer and the second hard mask material are both silicon-containing dielectric materials.

In a further embodiment, a second hard mask material layer of a second composition is disposed over the first hard mask material layer. The second hard mask material layer is also patterned with the mask features, and the sacrificial material has a top surface planarized over the second hard mask material.

In a further embodiment, the sacrificial material is recessed within the mask features, with a top surface of the sacrificial material recessed below a top surface of the first hard mask material.

In a further embodiment, the first hard mask layer is carbon-based material having more than 80 wt % carbon and has a thickness of 100-200 nm. The patterned substrate layer comprises a silicon-containing dielectric material, and the substrate features have a critical dimension of less than 50 nm.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A method of fabricating an integrated device, the method comprising:
   receiving a substrate with a patterned mask, wherein the patterned mask includes non-planar mask features formed in the patterned mask itself; wherein the mask comprises multiple masking material layers, including a first mask material layer disposed above the substrate and under a second mask material layer, wherein the second mask material layer is of different composition than the first mask material layer;
   etching a pattern in at least a portion of one or more layers, wherein the etched pattern includes non-planar substrate features formed in the substrate itself;
   backfilling the etched pattern with a sacrificial material, wherein the sacrificial material has the same composition as the first mask layer;
   removing at least a top portion of the mask with the scarification material present; and
   removing the sacrificial material selectively to the non-planar substrate features of the patterned one or more layers.

2. The method of claim 1, wherein:
   etching the pattern in one or more layers further comprises etching a layer of the substrate disposed below the patterned mask;
   backfilling the etched pattern further comprises:
      filling the pattern in the mask with the sacrificial material completely covering the etched substrate layer; and
      planarizing the sacrificial material over a top surface of the mask;
   removing the top portion of the mask further comprises:
      etching through the entire thickness of the sacrificial material disposed over the top surface of the mask; and
      etching through only a partial thickness of the mask; and
   removing a remainder of the sacrificial material also removes remaining mask material.

3. The method of claim 1, wherein:
   etching the pattern in one or more layers further comprises etching a layer of the substrate disposed below the mask;
   backfilling the etched pattern further comprises filling the pattern in the mask with the sacrificial material completely covering the etched substrate layer;
   removing the top portion of the mask further comprises etching through at least the second mask material layer; and
   removing a remainder of the sacrificial material also removes the first mask material layer.

4. The method of claim 1, wherein:
   etching the pattern in one or more layers further comprises etching a layer of the substrate disposed below the mask;
   backfilling the etched pattern further comprises filling the pattern in the mask with the sacrificial material completely covering the etched substrate layer;
   removing the top portion of the mask further comprises etching through at least the second mask material layer; and
   removing a remainder of the sacrificial material also removes the first mask material layer.

5. The method of claim 1, wherein:
   etching the pattern in one or more layers further comprises etching a layer of the substrate disposed below the mask, wherein the etched substrate layer has the same composition as the second mask material layer;
   backfilling the etched pattern further comprises filling the pattern in the mask with the sacrificial material completely covering the etched substrate layer;
   removing the top portion of the mask further comprises etching through at least the second mask material layer; and
   removing a remainder of the sacrificial material also removes the first mask material layer.

6. The method of claim 1, wherein:
the mask comprises multiple masking material layers, including one or more photo-definable mask material layers disposed over one or more non-photo-definable hard mask material layers;
etching the pattern in one or more layers further comprises:
  etching through the one or more hard mask material layers; and
  etching a layer of the substrate disposed below the patterned mask;
backfilling the etched pattern further comprises filling the pattern in the mask with the sacrificial material to completely cover the etched substrate layer; and
removing the top portion of the mask further comprises etching through at least one of the hard mask material layers.

7. A method of fabricating an integrated microelectronic device, the method comprising:
receiving a substrate with a mask having multiple masking material layers, the mask including one or more patterned photo-definable mask material layers and a plurality of unpatterned non-photo-definable hard mask material layers, the plurality or hard mask layers disposed above the substrate and below the one or more patterned photo-definable mask material layers further including a first hard mask material layer disposed above the substrate and below a second hard mask material layer; wherein the second mask material layer is of different composition than the first mask material layer;
patterning the hard mask material layers by etching through the plurality of hard mask material layers to form non-planar mask features; and
patterning the substrate by etching at least a portion of a substrate layer disposed below the first hard mask material layer to form non-planar substrate features;
backfilling the etched pattern with a sacrificial material completely covering the etched substrate layer, wherein the sacrificial material has the same composition as the first mask layer;
etching through the second hard mask material layer while the sacrificial material is present, the etching terminated on the first hard mask material layer; and
concurrently removing a remainder of the sacrificial material and the first hard mask material layer selectively relative to the substrate layer.

8. The method of claim 7, further comprising:
forming a plurality of transistor gate electrodes on the substrate;
depositing the substrate layer over the gate electrodes; and
wherein patterning the substrate further comprises forming a gate contact opening in the substrate layer over at least one of the gate electrodes by etching through the substrate layer to expose a top surface of the gate electrode.

9. The method of claim 7, wherein:
backfilling the etched pattern with the sacrificial material further comprises planarizing the sacrificial material over a top surface of the mask; and
the method further comprises
  etching through the entire thickness of the sacrificial material disposed over the top surface of the mask.

10. The method of claim 7, wherein:
backfilling the etched pattern with the sacrificial material further comprises applying a carbon-based material with a spin-on process; and
etching through the second hard mask material layer comprises etching the carbon-based material at a rate at least equal to etch rate of the second hard mask material layer.

11. The method of claim 7, wherein:
backfilling the etched pattern with the sacrificial material further comprises applying the sacrificial material with a spin-on process.

12. The method of claim 7, wherein:
the substrate layer is a silicon-containing dielectric material;
the first hard mask material layer is a carbon-based material deposited on the substrate layer, the carbon-based material having more than 80 wt % carbon;
the second hard mask material layer is a silicon-containing dielectric material and is deposited on the first hard mask material layer; and
backfilling the etched pattern with the sacrificial material further comprises applying the carbon-based material over the etched mask materials with a spin-on process.

13. The method of claim 7, wherein:
the substrate layer is SiC;
the first hard mask material layer is a carbon-based material deposited on the substrate layer, the carbon-based material having more than 80 wt % carbon;
the second hard mask material layer is a silicon-containing dielectric material and is deposited on the first hard mask material layer; and
backfilling the etched pattern with the sacrificial material further comprises applying the carbon-based material over the etched mask materials with a spin-on process.

14. A microelectronic device structure, comprising:
a patterned substrate layer having patterned non-planar substrate features formed in the substrate layer itself;
a patterned mask disposed over the patterned substrate layer, the mask including a first hard mask material layer of a first composition that is patterned with non-planar mask features that are formed in the first patterned mask itself and aligned to the non-planar substrate features; and
a sacrificial material disposed over the non-planar substrate features and backfilling the non-planar mask features, wherein the sacrificial material and the first hard mask material are of the same carbon-based non-photo-definable material.

15. The device structure of claim 14, wherein the patterned substrate layer comprises one or more gate contact openings passing through the substrate layer and exposing a top surface of a transistor gate electrode.

16. The device structure of claim 14, further comprising a second hard mask material layer of a second composition disposed over the first hard mask material layer, wherein the second hard mask material layer is also patterned with the non-planar mask features.

17. The device structure of claim 14, further comprising a second hard mask material layer of a second composition disposed over the first hard mask material layer, wherein the second hard mask material layer is also patterned with the non-planar mask features; and
wherein the patterned substrate layer and the second hard mask material are both silicon-containing dielectric materials.

18. The device structure of claim 14, further comprising a second hard mask material layer of a second composition disposed over the first hard mask material layer, wherein the second hard mask material layer is also patterned with the non-planar mask features; and wherein the sacrificial material has a top surface planarized over the second hard mask material.

19. The device structure of claim 14, wherein the sacrificial material is recessed within the non-planar mask features, with a top surface of the sacrificial material recessed below a top surface of the first hard mask material.

20. The device structure of claim 14, wherein:
the first hard mask layer is carbon-based material having more than 80 wt % carbon and has a thickness of 100-200 nm;
the patterned substrate layer comprises a silicon-containing dielectric material; and
the non-planar substrate features have a critical dimension of 20-50 nm.

* * * * *